United States Patent
Sato

(10) Patent No.: US 7,378,888 B2
(45) Date of Patent: May 27, 2008

(54) DELAY-LOCKED LOOP CIRCUIT

(75) Inventor: Hiroki Sato, Kanagawa (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/394,389

(22) Filed: Mar. 30, 2006

(65) Prior Publication Data
US 2007/0024335 A1   Feb. 1, 2007

(30) Foreign Application Priority Data
Mar. 31, 2005   (JP) .............................. 2005-105093

(51) Int. Cl.
*H03L 7/06* (2006.01)
(52) U.S. Cl. ....................... 327/158; 327/149
(58) Field of Classification Search ............. None
See application file for complete search history.

(56) References Cited

U.S. PATENT DOCUMENTS 6,803,797 B2 * 10/2004 Park .......................... 327/158

* cited by examiner

*Primary Examiner*—Cassandra Cox
(74) *Attorney, Agent, or Firm*—William B Kempler; W. James Brady, III; Frederick J. Telecky, Jr.

(57) ABSTRACT

The delay of delay circuit 10 is set within a predetermined range, and, in a stop mode, the clock pulses of 1 cycle of clock signal φin when transition is made from the stop mode to the DLL mode are excluded from the object detected by phase detector 20 such that phase difference Δφ' detected by phase detector 20 is within a prescribed range when said transition is performed. As a result, it is possible to lock the delay of clock signal φdin with respect to clock signal φin at a desired value (e.g., "2π"), and it is possible to prevent locking to an undesired abnormal state.

19 Claims, 10 Drawing Sheets

*FIG. 4*
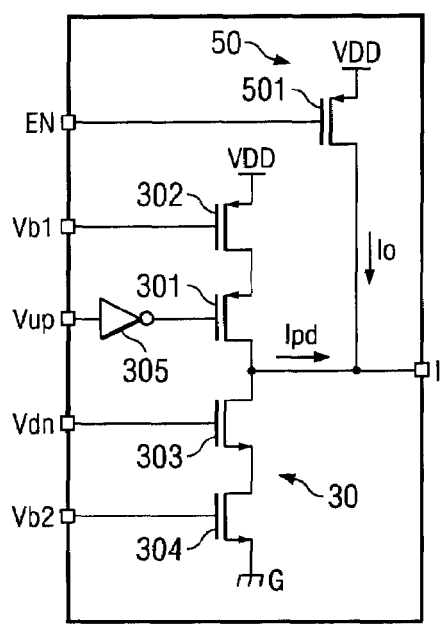
*FIG. 5*
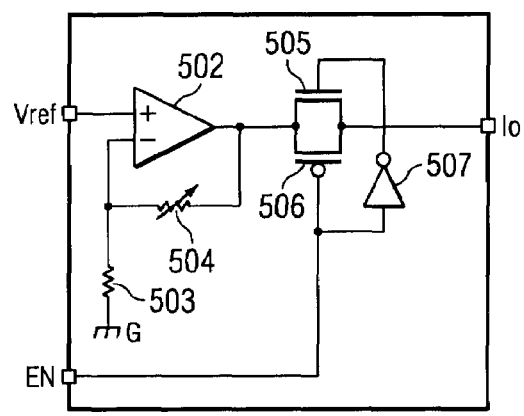
*FIG. 6*
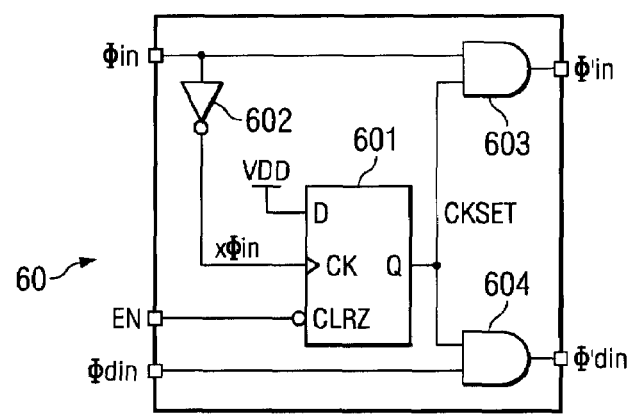
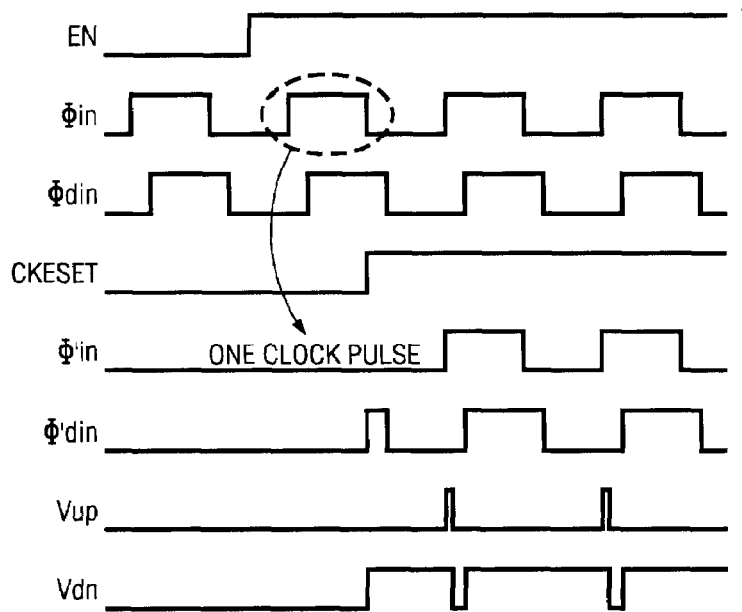
*FIG. 7*

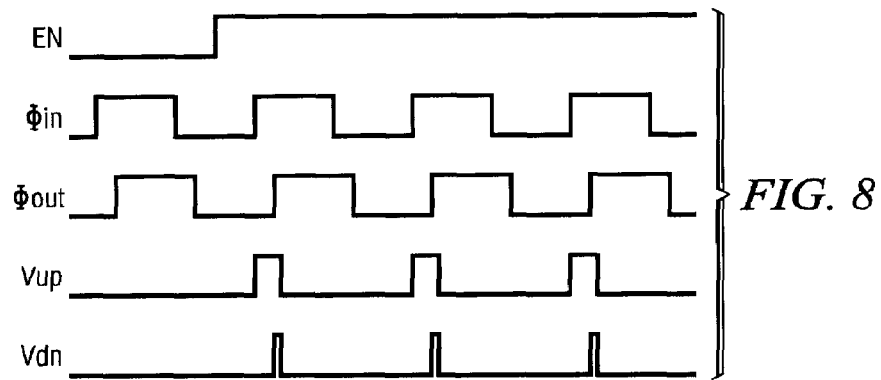
*FIG. 8*
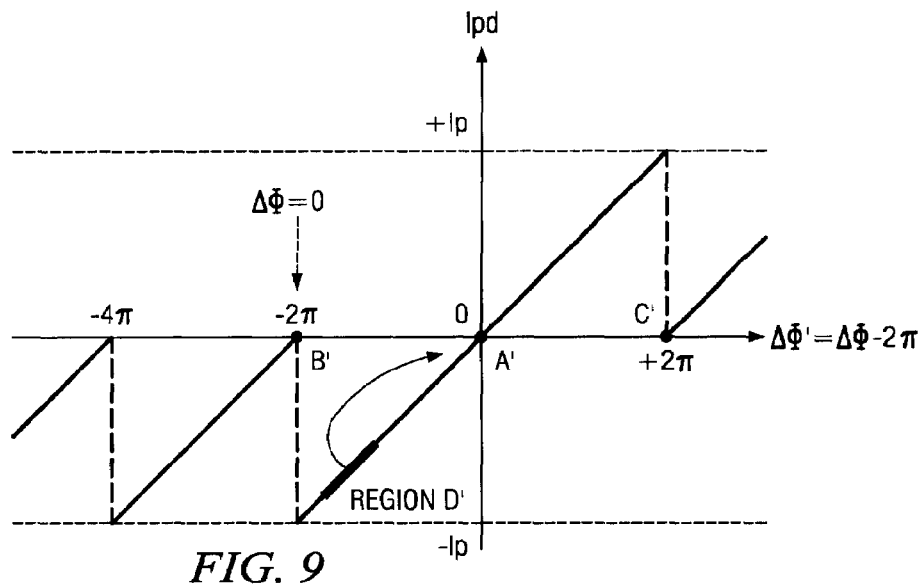
*FIG. 9*
*FIG. 11*
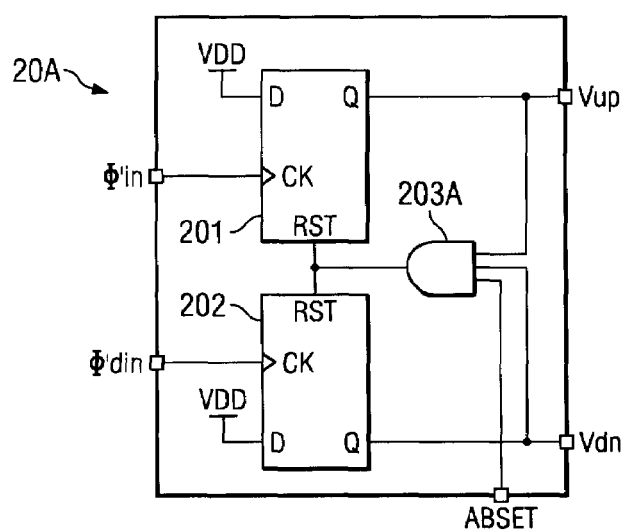

DELAY-LOCKED LOOP CIRCUIT

FIELD OF THE INVENTION

The present invention pertains to a type of delay-locked loop circuit. Especially, the present invention pertains to a type of delay-locked loop circuit for preventing locking to an abnormal phase state.

BACKGROUND OF THE INVENTION

The delay-locked loop circuit (hereinafter to be referred to as DLL circuit) is a circuit that generates any signal phase locked to a clock signal or the like. FIG. 22 is a diagram illustrating an example of the constitution of a DLL circuit of the prior art. The DLL circuit shown in FIG. 22 has delay line 1, phase detector (phase comparator) 2, charge pump 3, and low-pass filter 4. Said delay line 1 delays input clock signal φin and outputs a delayed signal. The delay time of delay line 1 can be changed corresponding to control voltage V1f. Said phase detector 2 detects the phase difference between clock signal φin input to delay line 1 and clock signal φout (φdin), and it generates signals (Vup, Vdn) corresponding to the phase difference. Said charge pump circuit 3 outputs current Ipd corresponding to the signals (Vup, Vdn) as the phase detection result output from phase detector 2. Low-pass filter 4 smooths current Ipd output from charge pump circuit 3 and converts it to control voltage V1f.

The basic function of the DLL circuit is to provide a prescribed delay by delay line 1 for input clock signal φin. The output current Ipd of charge pump circuit 3 is smoothed by low-pass filter 4, and it is then sent as control voltage V1f to delay line 1. The delay of delay line 1 is controlled corresponding to said control voltage V1f. Said control voltage V1f is determined as follows. When the phase of clock signal φdin lags behind clock signal pin, said phase detector 2 generates signal Vup having a pulse width corresponding to the delay quantity of the phase (FIG. 23). Conversely, when the phase of clock signal φdin is ahead of clock signal φin, phase detector 2 generates signal Vdn having a pulse width corresponding to the advance quantity of the phase (FIG. 24). The advance or delay in the phase detected by phase detector 2 is judged by comparing the rising edges of the two clock signals (φin, φdin). For example, as shown in FIG. 23, for the two rising edges as the objects for comparison, assume that the edge of clock signal φdin is generated behind the edge of clock signal φin (FIGS. 23(A), (B)). In this case, phase detector 2 judges that the phase of clock signal φdin lags behind clock signal φin, and it generates signal Vup (FIG. 23(C)).

On the other hand, as shown in FIG. 24, for the two rising edges as the objects for comparison, assume that the edge of clock signal φdin is ahead of the edge of clock signal φin (FIGS. 24(A), (B)). In this case, phase detector 2 judges that the phase of clock signal φdin is ahead of clock signal φin, and it generates signal Vdn (FIG. 24(D)).

In FIGS. 23 and 24, "Δφ" indicates the phase difference between clock signal φin and clock signal φdin detected by phase detector 2. When phase difference Δφ is positive, clock signal φdin lags behind clock signal φin, and when phase difference Δφ is negative, clock signal φdin is ahead of clock signal φin. Also, because clock signal φdin is a signal obtained by delaying clock signal φin via delay line 1, in consideration of this delay, the phase of clock signal φdin cannot be ahead of the phase of clock signal φin. The "advance in phase" and "delay in phase" detected by phase detector 2 is determined by the give-and-take relationship between the two rising edges as the objects for comparison, and it may not be in agreement with the actual delay of clock signal φdin with respect to clock signal φin.

While phase detector 2 outputs Vup, charge pump circuit 3 feeds current $I_p$ to low-pass filter 4 during the period. By means of this current $I_p$, a capacitor (not shown in the figure) contained in low-pass filter 4 is charged, and control voltage V1f output from low-pass filter 4 rises. On the other hand, while phase detector 2 outputs signal Vdn, charge pump circuit 3 pulls current $I_p$ from low-pass filter 4 during this period. By means of this current $I_p$, the capacitor contained in low-pass filter 4 discharges, and control voltage V1f output from low-pass filter 4 falls.

When the capacitance of this capacitor is "$C_p$," control voltage V1f can be represented by the following formula.

[Mathematical formula 1]

$$V_{1f}(t) = \frac{I_p}{2\pi C_p} t \Delta\phi u(t) \tag{1}$$

In formula (1), "u(t)" represents a step function.

The delay of delay line 1 decreases as control voltage V1f increases, and it increases as control voltage V1f decreases. In this case, when phase difference Δφ is positive (the phase of clock signal φdin lags), in phase detector 2, signal Vup is generated, control voltage V1f increases, and the delay of delay line 1 decreases. On the other hand, when phase difference Δφ is negative (phase of clock signal φdin is ahead), phase detector 2 generates signal Vdn, control voltage V1f decreases, and the delay of delay line 1 increases. Due to said operation, in the DLL circuit shown in FIG. 22, when the phase of clock signal φin and the phase of clock signal φdin come into agreement as detected by phase detector 2, a stable state (hereinafter to be referred to as locked state) results. In this case, the phase difference Δφ between clock signal φin and clock signal φdin is "2π," (where n is an integer). Usually, delay line 1 is formed by connecting plural inverters or other delay elements in tandem. Consequently, for example, when the DLL circuit is controlled such that the phase difference between input/output is delay line 1 of "2π," plural clock signals can be obtained that have different phase differences from "0" to "2π" with respect to clock signal φin.

FIG. 25 is a diagram illustrating an example of signals output from the delay elements when delay line 1 is formed by connecting, in tandem, four delay elements having the same delay. In the example shown in FIG. 25, the DLL circuit is controlled such that the phase difference between the input and output of delay line 1 becomes "2π." In this case, the phase difference between the delay elements with respect to clock signal φin sequentially becomes "π/2," "π," "3π/2," and "2π" from the initial stage. The signals output from the delay elements have their phases shifted from each other by "π/2."

In the DLL circuit shown in FIG. 22, control is performed such that phase difference Δφ between clock signal φin and clock signal φdin is "2π." Consequently, when integer n changes, all of the signals output from the various delay elements of delay line 1 change, and this is a problem. In the example shown in FIG. 25, a locked state occurs with a phase difference between clock signal φin and clock signal φdin of "2π," and integer n is "1." However, for the DLL circuit shown in FIG. 22, a locked state also can be obtained when integer n is not "1."

FIG. 26 is a diagram illustrating an example of the output signal of the delay element when the phase difference between clock signal φin and clock signal φdin is "4π" in the locked state (that is, when integer n is "2") in the DLL circuit having delay line 1 comprised of four delay elements in the same way as shown in FIG. 25. In this case, signals φ1~φ4 output from the delay elements shift in phase from each other by "π," and the apparent phase difference with respect to clock signal φin becomes "0" or "π." As shown in FIG. 25, this state is entirely different from the state of signals φ1~φ4 with phases shifted from each other by "π/2."

In the following, an explanation will be given on this problem from another viewpoint. FIG. 27 is the relationship between detected phase difference Δφ detected in phase detector 2 as abscissa and output current Ipd of charge pump circuit 3 as ordinate. Said phase detector 2 and charge pump circuit 3 operate along the solid lines in FIG. 27. When the phase difference Δφ in the initial state is in the range of "+2π<Δφ<+4π," because the phase of clock signal φdin lags behind the phase of clock signal φin, signal Vup is generated in phase detector 2 so as to drive the phase of clock signal φdin ahead, and control is performed for the system until "Δφ=+2π." Consequently, the DLL circuit reaches the locked state at point A as shown in FIG. 27. In this case, the phase difference between clock signal φin and clock signal φdin becomes "2π," so that normal signals as shown in FIG. 25 are output from the various delay elements of delay line 1.

With an initial state of "0<Δφ<+2π," the phase of clock signal φdin lags behind clock signal φin, so that signal Vup is generated in phase detector 2, and the system is controlled such that "Δφ=0." Consequently, the DLL circuit reaches the locked state at point B as shown in FIG. 27. Because the delay of delay line 1 is not strictly zero, the DLL circuit becomes stable while control is continued so that it is locked at point B. Even if the initial state is "−2π<Δφ<0," because the system is controlled such that "Δφ=0," the DLL circuit becomes locked at point B as shown in FIG. 27. With an initial state of "+4π<Δφ<+6π," the system is controlled such that "Δφ=+4π," and the DLL circuit reaches the locked state at point C as shown in FIG. 27. In this case, for example, the delay elements of delay line 1 generate abnormal signals as shown in FIG. 26. The aforementioned abnormal locked state is generated corresponding to the initial state of phase difference Δφ when the DLL circuit is started. In addition, it also takes place in some other cases during the operation of the DLL circuit, such as when the operation departs from the locus of the intrinsic feedback control due to external noise, etc., and when there is a significant change in the frequency of clock signal φin.

FIG. 28 is a diagram illustrating an example of change in the lock state due to a change in the frequency of clock signal φin. It can be seen that although the lock state is normal at a certain frequency (n=1), the lock state becomes abnormal when the frequency of clock signal φin is changed and doubled (n=2). In the example shown in FIG. 28, the lock state shifts from point A shown in FIG. 27 to point C. For the DLL circuit, when operation continues in said abnormal lock state, the circuit that operates based on the clock signal generated by DLL circuit becomes unstable, so that mis-operation takes place, and the power consumption rises due to waste. This is undesirable.

A general object of the present invention is to solve the aforementioned problems of the prior art by providing a type of delay-locked loop circuit that can prevent an abnormal lock state during start-up. Another general object of the present invention is to provide a type of delay-locked loop circuit that can prevent continuous operation in an abnormal lock state.

SUMMARY OF THE INVENTION

According to a first aspect of the present invention, the present invention provides a type of delay-locked loop circuit characterized by the fact that it has the following parts: a delay circuit that provides a delay corresponding to the input control signal for an input first clock signal, and outputs the delayed signal as a second clock signal, a phase detector that detects advance or delay in the phase of said second clock signal with respect to said first clock signal, a delay controller, which generates said control signal setting the delay of said delay circuit in a prescribed range in a first mode, and which generates said control signal to control the delay of said delay circuit so that the advance or delay in the phase detected by said phase detector is reduced in a second mode, and a phase-detection controller that performs the following operation: when transition is made from said first mode to said second mode, at least one cycle of the clock pulse of said first clock signal or said second clock signal is excluded from the object detected by said phase detector in said transition such that the advance or delay of the phase of said second clock signal is detected by said phase detector.

According to the second aspect of the present invention, the present invention provides a type of delay-locked loop circuit characterized by the fact that it has the following parts: a delay circuit, which provides plural different delays corresponding to an input control signal for an input first clock signal, and which outputs one of said plural delay signals as a second clock signal, a phase detector that detects the advance or delay in the phase of said second clock signal with respect to said first clock signal, a delay controller, which generates said control signal setting the delay of said delay circuit in a prescribed range in a first mode, and which generates said control signal to control the delay of said delay circuit so that the advance or delay in the phase detected by said phase detector is reduced in a second mode, a phase-detection controller that sets the advance or delay in the phase of said second clock signal detected by said phase detector in the prescribed range when transition is performed from said first mode to said second mode, a phase-judgment circuit that judges the phase state for at least two signals among the plural signals input/output in said delay circuit, and a transition-judgment circuit that judges whether the transition of the phase state judged with said phase-judgment circuit is a prescribed transition, and, if it is not the prescribed transition, changes the operation mode to said first mode. For example, said phase-judgment circuit judges said phase state based on the level of the other signal, at the rising edge or falling edge of one signal among plural signals, as the judgment object.

According to another aspect of the invention, the operation mode is changed to said second mode when the prescribed phase state is judged to be in said phase-judgment circuit after the operation mode is changed to said first mode.

According to a further aspect of the invention, the phase-detection controller excludes from the object detected by said phase detector at least one cycle of the clock pulse of said first clock signal or said second clock signal when transition is made from said first mode to said second mode.

According to yet another aspect of the invention, the phase detector detects the phase difference between said first clock signal and said second clock signal based on the time difference between the pulse edge as the reference point of the clock cycle in said first clock signal and the pulse edge as the reference point of the clock cycle in said second clock signal, and, at the same time, it judges whether the phase of said second clock signal has advanced with respect to said first clock signal during said transition based on the order said pulse edges are generated of when transition is made from said first mode to said second mode. In this case, for said phase-detection controller, the following scheme may be adopted: when transition is made from said first mode to said second mode, said phase-detection controller excludes said pulse edges of at least one cycle of said first clock signal or said second clock signal input to said phase detector.

According to a still further aspect of the invention, the phase-detection controller changes the number of said clock pulses excluded from the object detected by said phase detector in transition from said first mode to said second mode corresponding to the input second control signal.

BRIEF DESCRIPTION OF THE DRAWINGS

FIG. 4 is a diagram illustrating an example of the constitution of the charge-pumping circuit and the initial value setter in the DLL circuit shown in FIG. 1;

FIG. 5 is a diagram illustrating another example of the constitution of the initial value setter in the DLL circuit shown in FIG. 1;

FIG. 6 is a diagram illustrating an example of the constitution of the phase-detection controller in the DLL circuit shown in FIG. 1;

FIG. 7 is a diagram illustrating an example of timing of the various signals in the DLL circuit of the present embodiment;

FIG. 8 is a diagram illustrating an example of timing when the operation of the phase-detection controller in the DLL circuit is made invalid;

FIG. 9 is a diagram illustrating an example of the relationship between the phase difference detected by the phase detector of the DLL circuit shown in FIG. 1 and the output current of the charge-pumping circuit;

FIG. 11 is a diagram illustrating an example of the constitution of the phase detector in the DLL circuit shown in FIG. 10;

REFERENCE NUMERALS AND SYMBOLS AS SHOWN IN THE DRAWINGS

Figure 1:
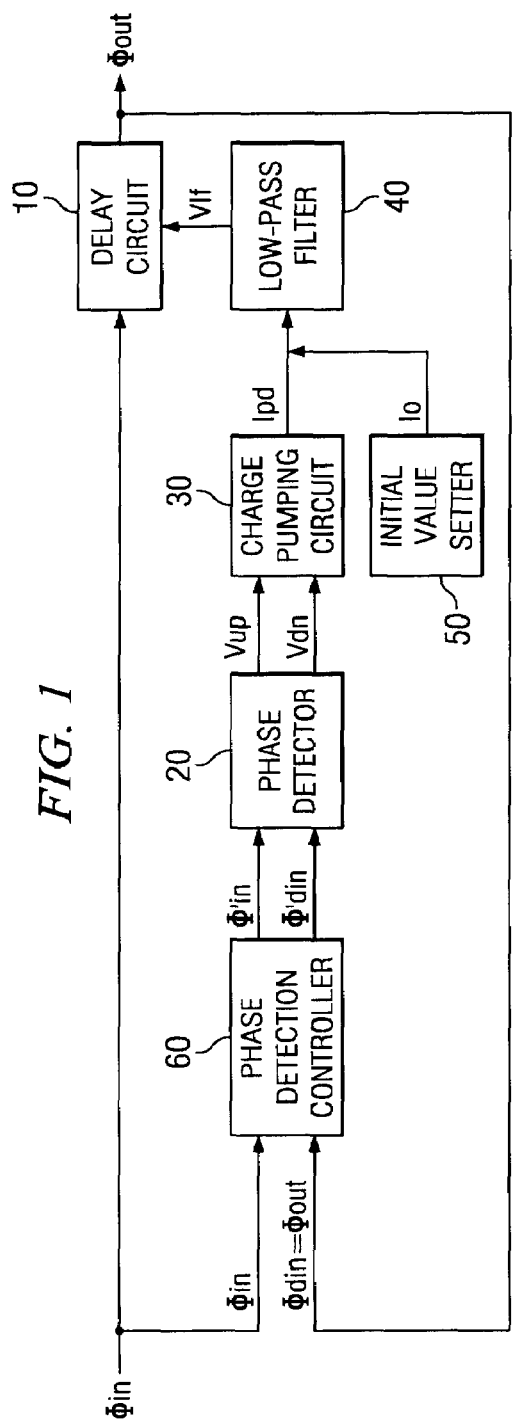
FIG. 1 is a diagram illustrating an example of the constitution of the DLL circuit in Embodiment 1.

10 Delay circuit
20, 20A Phase detector
30 Charge-pumping circuit
40 Low-pass filter
50, 50A Initial value setter
60, 60A Phase-detection controller
70 Phase-judgment circuit
80 Transition-judgment circuit
101~104 Delay element

DESCRIPTION OF THE EMBODIMENTS

According to aspects of the present invention, first, it is possible to prevent an abnormal lock state at start-up and second, it is possible to prevent continuous operation in an abnormal lock state. In the following, an explanation will be given regarding embodiment of the present invention with reference to figures.

Embodiment 1

FIG. 1 is a diagram illustrating an example of the constitution of the DLL circuit pertaining to Embodiment 1 of the present invention. The DLL circuit shown in FIG. 1 has delay circuit 10, phase detector (phase comparator) 20, charge-pumping circuit 30, low-pass filter 40, initial value setter 50, and phase-detection controller 60. Said delay circuit 10 is an embodiment of the delay circuit of the present invention. Said phase detector (phase comparator) 20 is an embodiment of the phase detector (phase comparator) of the present invention. The circuit containing charge-pumping circuit 30, low-pass filter 40 and initial value setter 50 is an embodiment of the delay controller of the present invention. Said charge-pumping circuit 30 is an embodiment of the charge-pumping circuit of the present invention. Said low-pass filter 40 is an embodiment of the low-pass filter of the present invention. Said initial value setter 50 is one embodiment of initial value setter 50 of the present invention. Said phase-detection controller 60 is an embodiment of the phase-detection controller of the present invention. Said delay circuit 10 provides input clock signal φin a delay corresponding to control voltage V1$f$, and outputs the obtained signal as clock signal (φout (φdin).

Figure 2:
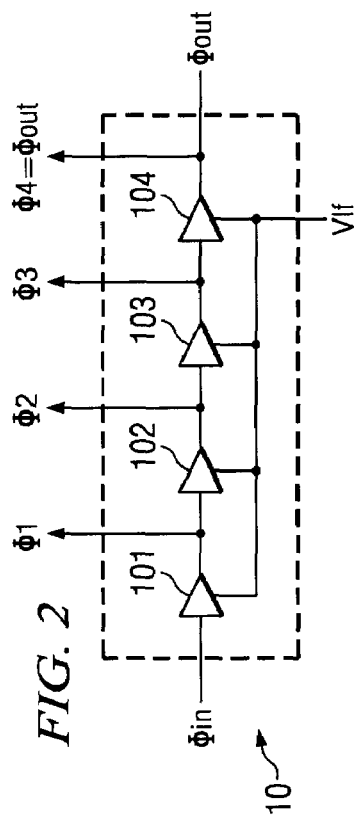
FIG. 2 is a diagram illustrating an example of the constitution of the delay circuit in the DLL circuit shown in FIG. 1.

FIG. 2 is a diagram illustrating an example of the constitution of said delay circuit 10. Said delay circuit 10 shown in FIG. 2 has delay elements 101, 102, 103 and 104 connected in tandem. First-stage delay element 101 outputs delay signal φ1, second-stage delay element 102 outputs delay signal φ2, third-stage delay element 103 outputs delay signal φ3, and last-stage delay element 104 outputs delay signal φ4(=φout=φdin). The delays of said delay elements 101-104 are changed corresponding to control voltage V1$f$. For example, under the same control voltage V1$f$, the delays of control voltage V1$f$. For example, under the same control voltage V1$f$, the delays of delay elements 101-104 have nearly the same values. Said phase detector 20 detects the advance or delay in the phase of clock signal φ'din with respect to clock signal φ'in. Said clock signal φ'in corresponds to clock signal φin, and said clock signal φ'din corresponds to clock signal φdin. Said clock signal φ'in and clock signal φ'din are subjected to a prescribed treatment in phase-detection controller 60 to be explained later when the DLL operation starts. Then, during execution of the DLL operation, they become nearly equal to clock signals φin and φdin, respectively.

For example, based on the time difference between the rising edge of clock signal φ'in and the rising edge of clock signal φ'din, phase detector 20 detects the phase difference between the two clock signals. Also, based on the order of generation of the rising edges when transition is made from a mode in which the DLL operation is stopped (hereinafter to be referred to as stop mode) to a mode in which when the DLL operation is performed (hereinafter to be referred to as DLL mode), whether the phase of clock signal φ'din is advanced or delayed with respect to clock signal φ'in in said transition is judged.

Figure 3:
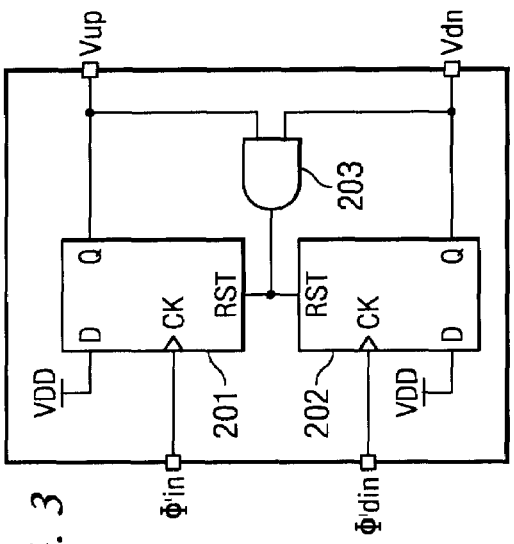
FIG. 3 is a diagram illustrating an example of the constitution of the phase detector in the DLL circuit shown in FIG. 1.

FIG. 3 is a diagram illustrating an example of the constitution of phase detector 20 for realizing said operation. As shown in FIG. 3, phase detector 20 has D-type flip-flop circuits 201 and 202, and AND circuit 203. Locked to the rising edge of clock signal φ'in, flip-flop circuit 201 outputs high-level signal Vup, and holds its output level. When the output signal of AND circuit 203 becomes high-level, signal Vup is reset at low level. Locked to the rising edge of clock signal φ'din, flip-flop circuit 202 outputs high-level signal Vdn, and holds its output level. When the output signal of AND circuit 203 becomes high-level, signal Vdn is reset at low level. AND circuit 203 performs AND operation for signal Vup output from flip-flop circuit 201 and signal Vdn output from flip-flop circuit 202, and sends the obtained signal as a reset signal to flip-flop circuits 201 and 202.

In the transition from the stop mode to the DLL mode, while clock signal φ'in rises earlier than clock signal φ'din, locked to the rising edge, signal Vup becomes high-level. Then, as clock signal φ'din rises, the output signal of AND circuit 203 becomes high-level, and the output signals of flip-flop circuits 201 and 202 are immediately reset at low level. As a result, signal Vup is output from phase detector 20 during the period from the rising edge of clock signal φ'in to the rising edge of clock signal φ'din. This high-level signal Vup is output repeatedly for each later clock cycle as long as said clock signal φ'in rises earlier than clock signal φ'din.

On the other hand, when transition is made from the stop mode to the DLL mode when clock signal φ'in rises later than clock signal φ'din, the scenario is opposite the aforementioned, that is, high-level signal Vdn is output from phase detector 20. This high-level signal Vdn is repeatedly output for each later clock cycle as long as clock signal φ'in rises later than clock signal φ'din. Said charge-pumping circuit 30 generates current Ipd corresponding to the signal (Vup, Vdn) output as the detection result of phase detector 20, and it sends the current to low-pass filter 40. Said low-pass filter 40 smooths said current Ipd sent from charge-pumping circuit 30, and generates control voltage V1$f$. For example, said low-pass filter 40 contains a capacitor that charges/discharges by said current Ipd, and the voltage generated on the capacitor is output as control voltage V1$f$ to delay circuit 10. Said initial value setter 50 generates current I0 that sets control voltage V1$f$ in the prescribed range in the stop mode, and sends it to low-pass filter 40. For example, current I0 is generated such that control voltage V1$f$ is generated to minimize the delay of delay circuit 10 in low-pass filter 40. In the DLL mode, feed of current I0 to low-pass filter 40 is stopped.

FIG. 4 is a diagram illustrating an example of the constitution of charge-pumping circuit 30 and initial value setter 50. Said charge-pumping circuit 30 shown in FIG. 4 has p-type MOS transistors 301 and 302, n-type MOS transistors 303 and 304, and inverter circuit 305. Also, initial value setter 50 shown in FIG. 4 has p-type MOS transistor 501. The source of p-type MOS transistor 301 is connected via p-type MOS transistor 302 to power source voltage VDD. Its drain is connected to the drain of n-type MOS transistor 303, and a signal obtained as logic NOT of signal Vup by means of inverter circuit 305 is input to its gate. The source of n-type MOS transistor 303 is connected via n-type MOS device region 304 to reference potential G, and signal Vdn is input to its gate. A prescribed bias voltage Vb1 is applied to the gate of p-type MOS transistor 302, and a prescribed bias voltage Vb2 is applied to the gate of n-type MOS device region 304. From the drain commonly connected to p-type MOS transistor 301 and n-type MOS transistor 303, current Ipd is output. Said p-type MOS transistor 501 is connected between the output terminal for current Ipd of charge-pumping circuit 30 and power source voltage VDD, and enable signal EN is applied to its gate.

In the case of the DLL mode, enable signal EN becomes high-level, and p-type MOS transistor 501 is OFF. Consequently, current Ipd of charge-pumping circuit 30 is sent to low-pass filter 40. When signal Vup becomes high-level, the output of inverter circuit 305 becomes low-level, and p-type MOS transistor 301 is ON. Because prescribed bias voltage Vb1 is applied to the gate of p-type MOS transistor 302, prescribed current (+$I_p$) flows in p-type MOS transistor 302. This current flows from power source voltage VDD via p-type MOS transistors 302 and 301 to low-pass filter 40.

When signal Vdn becomes high-level, the gate of n-type MOS transistor 303 becomes high-level, so that n-type MOS transistor 303 is ON. Because prescribed bias voltage Vb2 is applied to the gate of n-type device region 304, a prescribed current ($-I_p$) flows in n-type device region 304. This current flows from low-pass filter 40 via p-type MOS transistors 301 and 302 to reference potential G.

On the other hand, in the stop mode, enable signal EN becomes high-level, and p-type MOS transistor 501 is ON. In the stop mode, the detection operation of phase detector 20 stops, and both signal Vup and signal Vdn are kept at low level. Consequently, current I0 flows from power source voltage VDD via p-type MOS transistor 501 to low-pass filter 40. Consequently, in the stop mode, current I0 of p-type MOS transistor 501 is sent to low-pass filter 40, and prescribed control voltage V1$f$ (such as a voltage that minimizes the delay of delay circuit 10) is generated corresponding to current I0 in low-pass filter 40.

FIG. 5 is a diagram illustrating another example of an initial value setter. Initial value setter 51 shown in FIG. 5 has op-amp 502, resistor 503, variable resistor 504, n-type MOS transistor 505, p-type MOS transistor 506 and inverter circuit 507. Reference voltage Vref is input to the positive input terminal of op-amp 502, and its negative input terminal is connected via resistor 503 to reference potential G, and, at the same time, it is connected via variable resistor 504 to the output terminal of op-amp 502. Also, the output terminal of op-amp 502 outputs current I0 via parallel connected n-type MOS transistor 505 and p-type MOS transistor 506 to low-pass filter 40. Enable signal EN is input to the gate of p-type MOS transistor 506, and the signal as NOT of enable signal EN obtained by means of inverter circuit 507 is input to the gate of n-type MOS transistor 505. If the resistance of resistor 503 is "R1" and the resistance of variable resistor 504 is "R2," output voltage V0 of op-amp 502 is:

$$VO=(1+R2/R1)\cdot Vref$$

In the stop mode, as enable signal EN becomes low-level, both n-type MOS transistor 505 and p-type MOS transistor 506 are ON. Consequently, voltage V0 is fed via these transistors to low-pass filter 40. By controlling the resistance of variable resistor 504 from the outside by a resistor, etc., so as to set output voltage V0 of op-amp 502 appropriately, it is possible to set control voltage V1$f$ generated in low-pass filter 40 at a prescribed voltage (such as a voltage that minimizes the delay of delay circuit 10).

When transition is performed from the stop mode to the DLL mode, phase-detection controller 60 excludes the clock pulses of 1 cycle of clock signal Pin in said transition from the detection objects of phase detector 20 so that the phase difference Δφ' detected by phase detector 20 (the delay in phase of clock signal φ'din with respect to clock signal φ'in) is within a prescribed range. For example, in transition from the stop mode to the DLL mode, phase-detection controller 60 treats clock signal φin and clock signal φdin so that the rising edge of clock signal φin is removed for 1 cycle, and it outputs signals as clock signal φ'in and clock signal φ'din to phase detector 20.

FIG. 6 is a diagram illustrating an example of the constitution of phase-detection controller 60. Said phase-detection controller 60, as shown in FIG. 6, has D-type flip-flop circuit 601, inverter circuit 602, and AND circuits 603 and 604. The inverter circuit outputs clock signal xφin obtained as logic NOT of clock signal φin. When enable signal EN is at high level, flip-flop circuit 601 outputs high-level signal CKSET locked to the rising edge of clock signal xφin, and it holds the level. When enable signal EN is at low level, signal CKSET is set at low level without regard to clock signal xφin. AND circuit 603 computes AND of clock signal φin and signal CKSET, and outputs the obtained signal as clock signal φ'in. AND circuit 604 computes AND of clock signal φdin and signal CKSET, and outputs the obtained signal as clock signal φ'din.

In the following, an explanation will be given regarding the operation of the DLL circuit pertaining to the present embodiment with the aforementioned constitution with reference to the timing graph shown in FIG. 7. FIG. 7 is a diagram illustrating an example of the timing of the various signals in the DLL circuit pertaining the present embodiment. In the stop mode, enable signal EN is set at low level. In this case, signal CKSET output from flip-flop circuit 601 of phase-detection controller 60 is at low level. Consequently, clock signal φ'in and clock signal φ'din are both at low level. Also, in the stop mode, current I0 is fed from initial value setter 50 (51) to low-pass filter 40. Control voltage V1$f$ output from low-pass filter 40 becomes a prescribed initial value. While control voltage V1$f$ set at the initial value is fed, the delay of delay circuit 10 becomes a minimum value, and the phase delay of clock signal φdin with respect to clock signal φin is set in the range of "0"~"π."

When transition is made from the stop mode to the DLL mode, enable signal EN is set at high level. When enable signal EN becomes high-level, the output of current I0 from initial value setter 50 (51) is stopped, and the output of initial value setter 50 (51) enters a impedance state. After transition from the stop mode to the DLL mode and before generation of the falling edge of clock signal φin (the rising edge of clock signal xφin), both clock signal φ'in and clock signal φ'din are kept at low level. As clock signal φin falls, output signal CKSET of flip-flop circuit 601 becomes high-level, AND circuits 603 and 604 become transmissive, and clock signal φin and clock signal φdin are directly output as clock signal φ'in and clock signal φ'din. In this case, because the fall of clock signal φin has just occurred, if the pulse duty is about 50%, clock signal φin remains low level for the next half cycle (that is, at timing with a leading phase of "π").

With respect to this, the delay of clock signal φdin with respect to clock signal φin is within the range of "0"~"π," so clock signal φdin becomes high-level before clock signal φin reaches the next rising edge. That is, clock pulses of 1 cycle present in clock signal φin right after transition from the stop mode to the DLL mode (right after the rising edge of enable signal EN) are removed by phase-detection controller 60. The rising edge of clock signal φ'din always takes place ahead of the rising edge of clock signal φ'in. Since the rising edge of clock signal φ'din is ahead of clock signal φ'in, it is judged that the phase of clock signal φ'din is in advance in phase detector 20, and, as shown in FIG. 7(H), signal Vdn is generated. As a result, control is performed to delay the phase of clock signal φdin, and the delay initially set in delay circuit 10 gradually becomes larger then the range of "0"~"π." As a result, the DLL circuit is locked when the phase difference between clock signal φin and clock signal φdin becomes "2π."

As shown in FIG. 8, as clock signal φin and clock signal φdin are directly fed to phase detector 20 right after rise of enable signal EN to high level, clock signal φdin rises later than clock signal φin, so it is judged that the phase of clock signal φdin is delayed in phase detector 20. In this case, control of the DLL circuit is performed so that the phase of clock signal φdin advances. In the example shown in FIG. 8, the DLL circuit is locked while the delay of delay circuit 10 becomes a minimum value. That is, as control of phase-detection controller 60 is made invalid, it is possible to judge that clock signal φdin is delayed from clock signal φin. It can be seen from the aforementioned fact that by removing the clock pulses of 1 cycle of clock signal φin, it is possible to delay the phase of clock signal φ'in forcibly by 1 cycle (phase of "2π") with respect to clock signal φ'din. If the phase of clock signal φin is "Pin1" and the phase of clock signal φ'in is "Pin2," the two phases have the following relationship.

[Mathematical Formula 2]

$$Pin2 = Pin1 - 2\pi \quad (2)$$

Also, if the phase of clock signal φdin is "Pdin1" and the phase of clock signal φ'din is "Pdin2," phase difference Δφ' of clock signal φ'din with respect to clock signal φ'in is represented by the following formula.

[Mathematical formula 3]

$$\begin{aligned}\Delta\phi' &= Pin2 - Pdin2 \quad (3)\\ &= (Pin1 - 2\pi) - Pdin1\\ &= \Delta\phi - 2\pi\end{aligned}$$

Because phase difference Δφ is set in the range of "0"~"π" by means of initial value setter 50 in the stop mode, in consideration of formula (3), the phase difference Δφ' at the start of control of the DLL circuit is set in the range of "−2π"~"−π."

Figure 25:
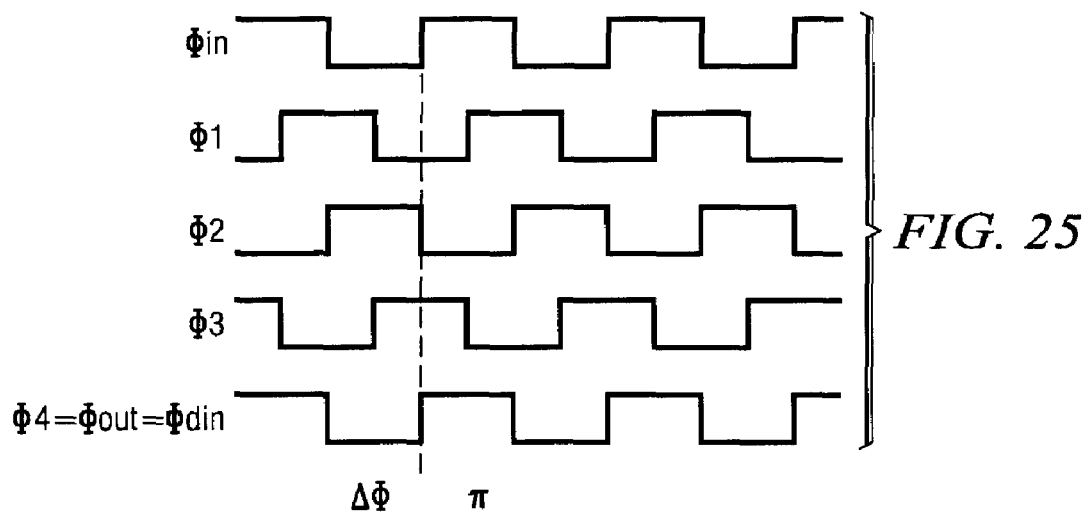
FIG. 25 is a diagram illustrating a first example of the signals output from the delay line of the DLL circuit shown in FIG. 22.
Figure 26:
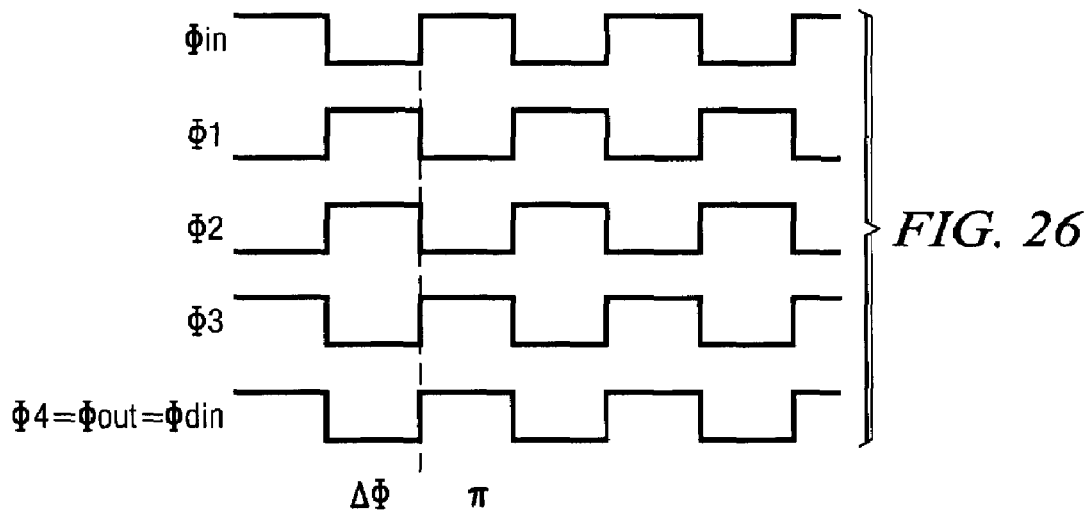
FIG. 26 is a diagram illustrating a second example of the signals output from the delay line of the DLL circuit shown in FIG. 22.

FIG. 9 is a diagram illustrating an example of the relationship between phase difference Δφ' detected by phase detector 20 and current Ipd of charge-pumping circuit 30. The abscissa represents phase difference Δφ', and the ordinate represents current Ipd. As can be seen from a comparison of FIGS. 9 and 27, the graph shown in FIG. 9 is equal to that obtained by a parallel shifting of "+2π" of the graph shown in FIG. 27 in the abscissa direction. Points A', B', C' in FIG. 8 correspond to points A, B, C in FIG. 27, respectively. After transition from the stop mode to the DLL mode, the apparent phase difference Δφ of clock signal φ'din with respect to clock signal φ'in is initially set in region D' of "−2π"~"−π." When control is performed to advance the phase of clock signal φdin from said region D', the DLL circuit enters a locked state at point A' in FIG. 8. At this point A', apparent phase difference Δφ' detected by phase detector 20 becomes zero, while the actual phase difference between clock signal φin and clock signal φdin generated in delay circuit 10 becomes "2π." Consequently, the DLL circuit enters a normal locked state that generates the delay signal as shown in FIG. 25.

As explained above, by means of the DLL circuit pertaining to the present embodiment, in the stop mode, the delay of delay circuit 10 is set within a prescribed range. Also, when transition is made from the stop mode to the DLL mode, the clock pulses of 1 cycle of clock signal φin in the transition are excluded from the object detected by phase detector 20 such that phase difference Δφ' detected by phase detector 20 is within the prescribed range. Consequently, after transition from the stop mode to the DLL mode, phase difference Δφ' of clock signal φ'din with respect to clock signal φ'in is initially set in the range of "−2π"~"−π," and, by performing control to delay the phase of clock signal φ'din from this state, the delay of delay circuit 10 is locked at the point at which the phase difference of clock signal φdin with respect to clock signal φin becomes "2π."

As explained above, for the DLL circuit in the present embodiment, by setting the delay of delay circuit 10 initially when the DLL operation is started and phase difference Δφ' detected by phase detector 20 in prescribed ranges, respectively, it is possible to lock the delay of delay circuit 10 so that the phase difference between clock signal φin and clock signal φdin generated in delay circuit 10 reaches a desired value (such as "2π"), and it is possible to prevent locking to an undesired abnormal state.

Embodiment 2

Figure 27:
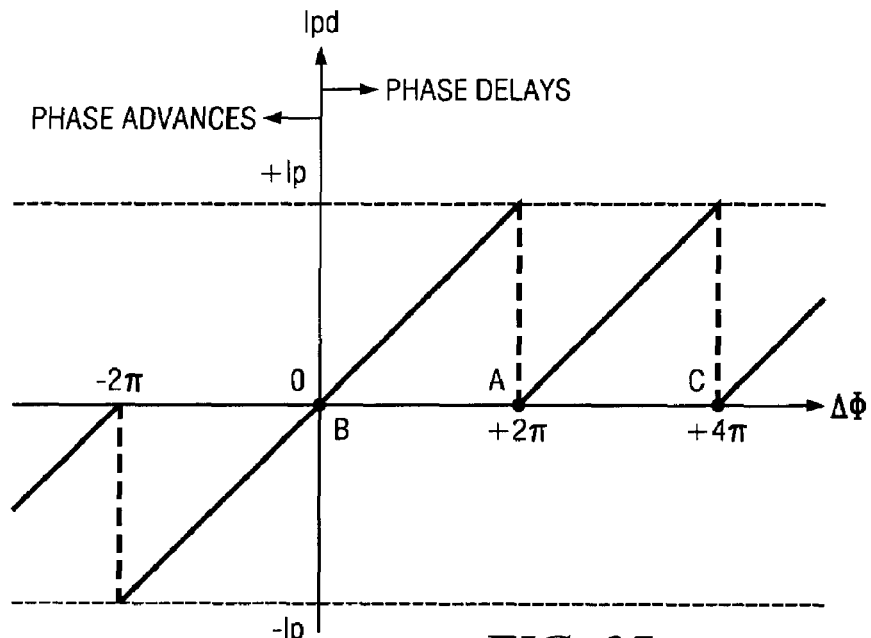
FIG. 27 is a diagram illustrating an example of the relationship between the phase difference detected by the phase detector of the DLL circuit shown in FIG. 22 and the output current of the charge-pumping circuit.
Figure 28:
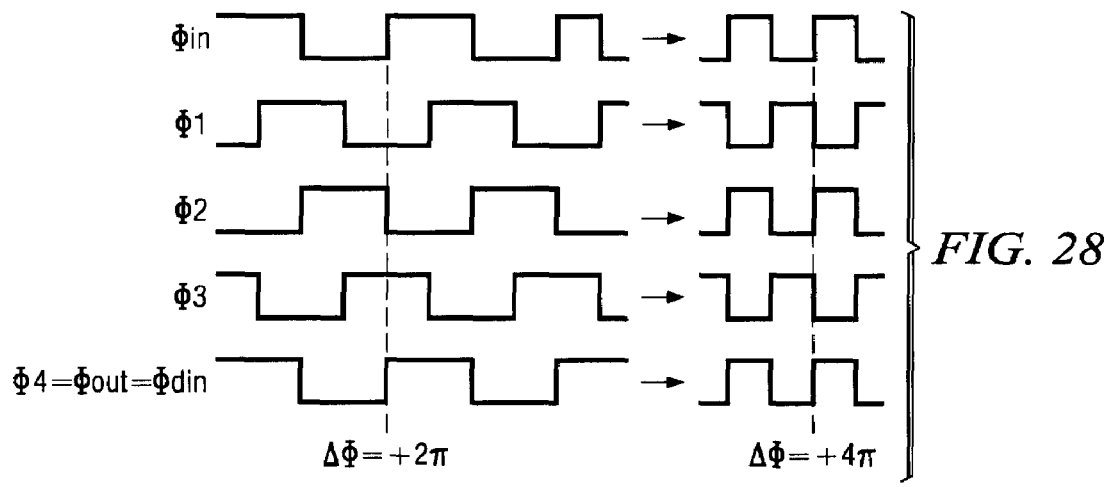
FIG. 28 is a diagram illustrating an example of change in the locked state due to change in the frequency of the clock signal input to the DLL circuit.

In the following, an explanation will be given regarding Embodiment 2 of the present invention. For the DLL circuit in Embodiment 2, it is checked whether the phase state of the delay signal generated in the delay circuit correctly changes, and, if an abnormal transition takes place, the DLL operation is paused and a prescribed initial state is set to correct the DLL operation. For example, when the lock locus is departed from due to the influence of external noise and variation in the frequency of clock signal φin, by correcting the DLL operation from an appropriate initial state, it is possible to prevent continuation of an abnormal locked state. For example, as shown in FIG. 27, when the initial phase difference in delay line 1 is "+2π"~"+4π," locking occurs at point A in the conventional DLL circuit. However, due to variation in the power source voltage and noise, etc., excessive pulses are superimposed on clock signals φin, φdin, and the phase difference becomes "+4π"~"+6π." As a result, control is performed so that the conventional DLL circuit is locked at point C instead of point A.

Figure 10:
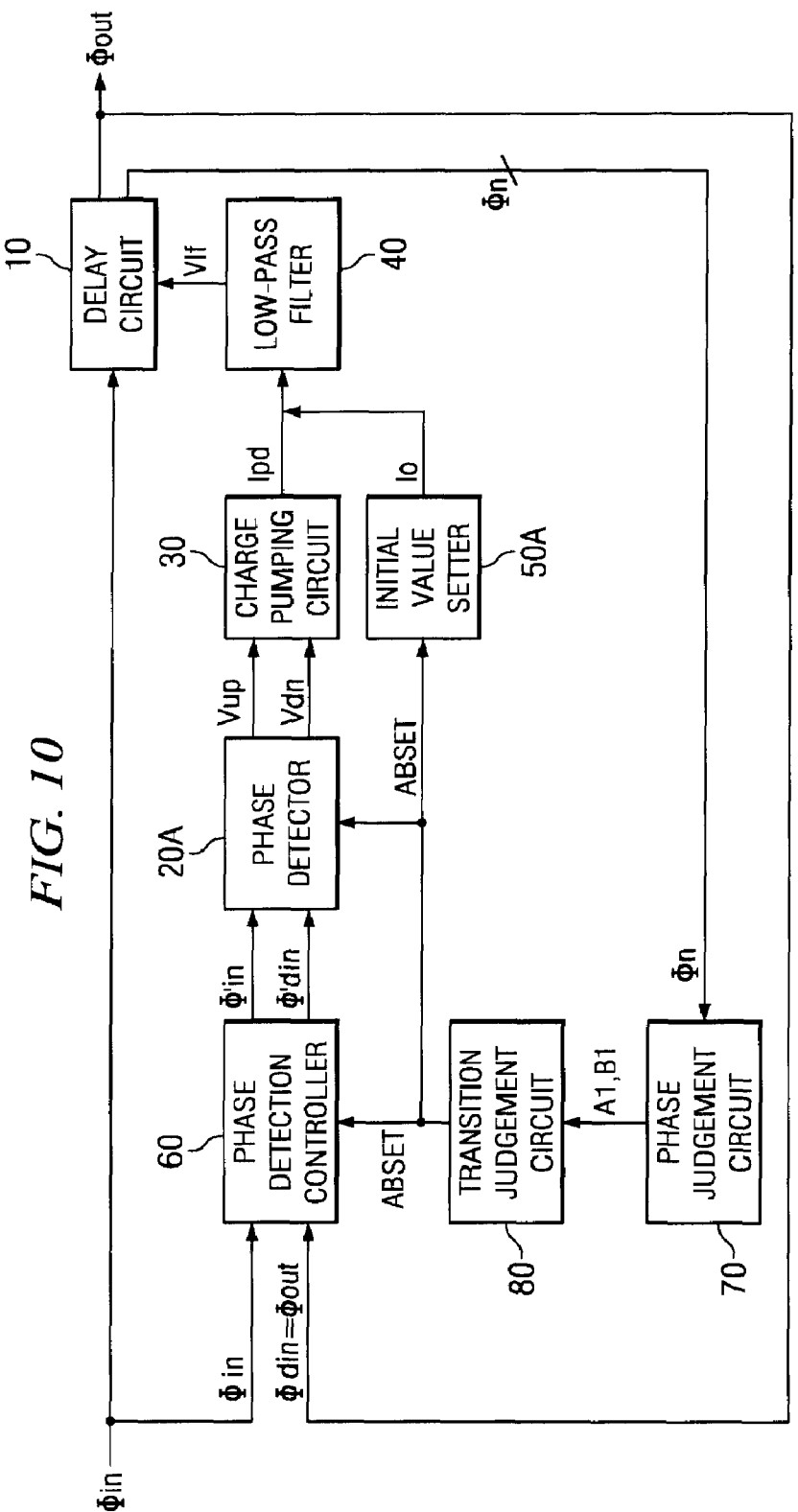
FIG. 10 is a diagram illustrating an example of the constitution of the DLL circuit pertaining to Embodiment 2.

In order to prevent this problem, for the DLL circuit of the present embodiment, when transition is made to an abnormal state from the phase state of the signal input/output in the delay circuit, the DLL operation is paused, the phase state is reset to the normal state, and the DLL operation is re-started from the normal state. FIG. 10 is a diagram illustrating an example of the constitution of the DLL circuit pertaining to Embodiment 2. The same part numbers as those adopted in FIG. 1 are adopted in FIG. 10. The DLL circuit shown in FIG. 10 has delay circuit 10, phase detector (20A), charge-pumping circuit 30, low-pass filter 40, initial value setter (50A), phase-detection controller 60, phase-judgment circuit 70 and transition-judgment circuit 80. Said phase-judgment circuit 70 is an embodiment of the phase-judgment circuit of the present invention. Said transition-judgment circuit 80 is an embodiment of the transition-judgment circuit of the present invention.

In the following, an explanation will be given regarding structural elements not contained in the DLL circuit shown in FIG. 1 (phase detector (20A), initial value setter (50A), phase-judgment circuit 70 and transition-judgment circuit 80), while the other structural members will not be explained. Said phase detector (20A) detects advance or delay of the phase of clock signal φ'din with respect to clock signal φ'in. Also, when output signal ABSET of transition-judgment circuit 80 becomes low-level that indicates transition of an abnormal phase state, the detection result of the phase detection (Vup, Vdn) is set at a prescribed initial state. FIG. 11 is a diagram illustrating an example of the constitution of phase detector (20A). Said phase detector (20A) shown in FIG. 11 is identical to phase detector 20 shown in FIG. 3 except that 3-input AND circuit (203A) is used in place of a 2-input AND circuit. AND circuit (203A) has output signal Vup of flip-flop circuit 201, output signal Vdn of flip-flop circuit 202 and output signal ABSET of transition-judgment circuit 80 input to it, and it sends their AND as the reset signal to flip-flop circuits 201 and 202.

By means of the circuit shown in FIG. 11, when output signal ABSET of transition-judgment circuit 80 is at low level, output signals Vup and Vdn of phase detector (20A) are always set at low level. When enable signal EN and/or signal ABSET are at low level, initial value setter (50A) generates current I0 that sets control voltage V1$f$ in a prescribed range, and sends it to low-pass filter 40.

Figure 12:
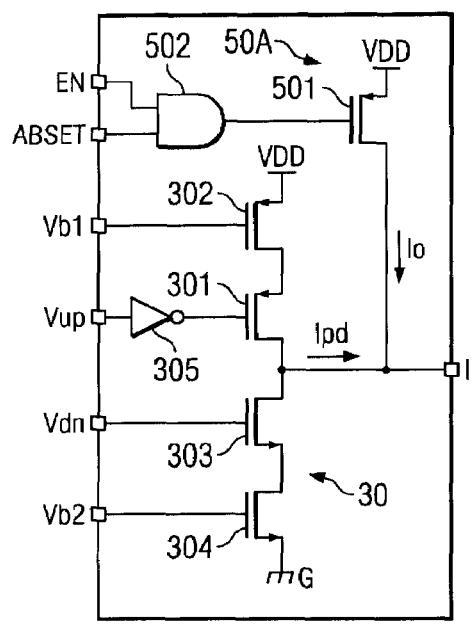
FIG. 12 is a diagram illustrating an example of the constitution of the initial value setter in the DLL circuit shown in FIG. 10.

FIG. 12 is a diagram illustrating an example of the constitution of initial value setter (50A). Just as initial value setter 50 shown in FIG. 4, said initial value setter (50A) has p-type MOS transistor 501, and it has AND circuit 502 that outputs the gate voltage to said. When enable signal EN and/or signal ABSET are at low level, said AND circuit 502 feeds a low level voltage to the gate of p-type MOS transistor 501, and turns on p-type MOS transistor 501. As a result, in addition to when enable signal EN is at low level, when signal ABSET is also at low level, current I0 is fed from initial value setter (51A) to low-pass filter 40.

Figure 13:
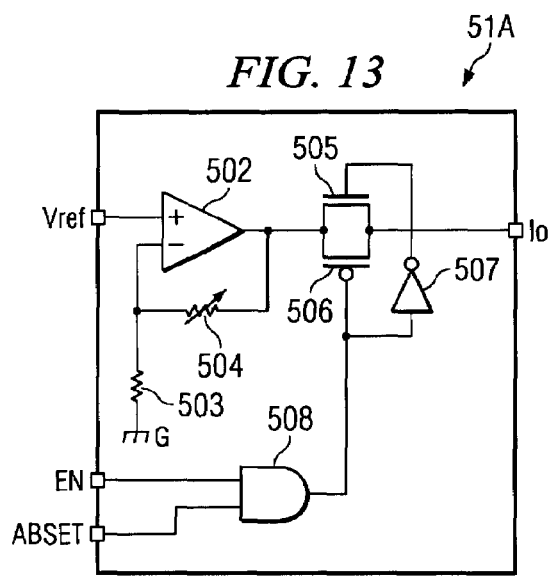
FIG. 13 is a diagram illustrating another example of constitution of the initial value setter in the DLL circuit shown in FIG. 10.

FIG. 13 is a diagram illustrating another example of an initial value setter. In addition to the constitution of initial value setter 51 shown in FIG. 5, initial value setter A) shown in FIG. 13 also has AND circuit 508. When enable signal EN and/or signal ABSET are at low level, AND circuit 508 feeds a low level voltage to the gate of p-type MOS transistor 506, and turns on p-type MOS transistor 506. Also, in this case, AND circuit 508 feeds a high level voltage via inverter circuit 507 to the gate of n-type MOS transistor 505, and turns on n-type MOS transistor 505. As a result, in addition to when enable signal EN is at low level, when signal ABSET is also at low level, current I0 is fed from initial value setter (51A) to low-pass filter 40.

Figure 14:
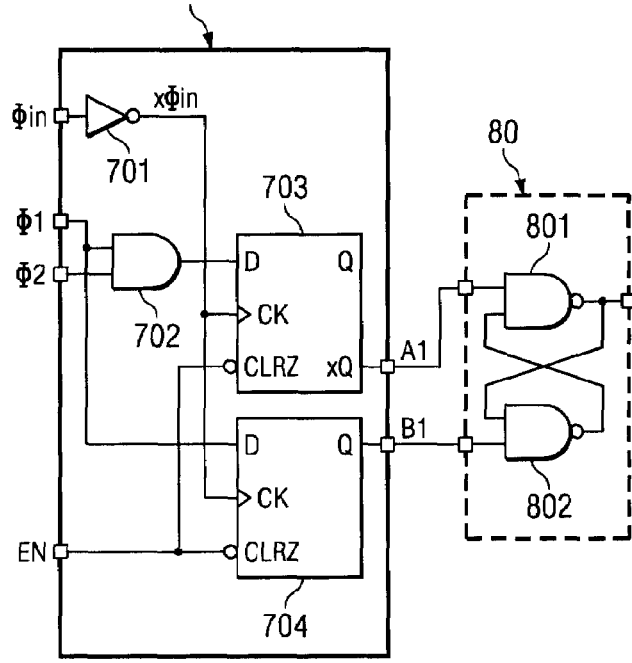
FIG. 14 is a diagram illustrating an example of the constitution of the phase-judgment circuit and the transition-judgment circuit.
Figure 14:
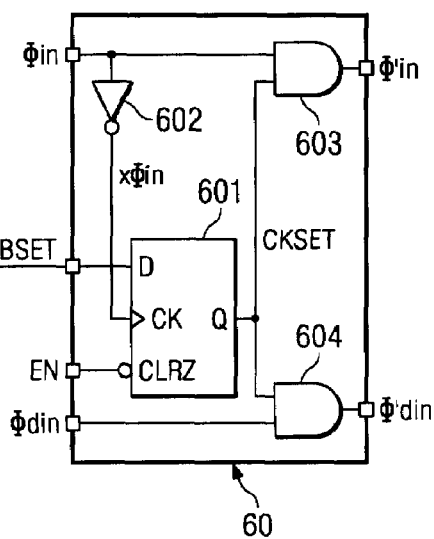

Said phase-judgment circuit 70 judges the state of the phase of at least two signals among plural signals (clock signal φin, delay signals φ1~φ4) input/output to delay circuit 10. For example, the phase state is judged based on the level of another signal at the rising edge or falling edge of a signal among the plural signals as the judgment objects. For example, phase-judgment circuit 70 shown in FIG. 14 judges whether delay signal φ1 at the falling edge of clock signal φin is at high level, and whether both difference signals φ1 and φ2 at the failing edge are at high level. Phase-judgement circuit 701 shown in FIG. 14 has inverter circuit 701, AND circuit 702, and flip-flop circuits 703 and 704. Said inverter circuit 701 performs a logic NOT operation for clock signal φin to generate clock signal xφin. Said AND circuit 702 computes the AND of difference signals φ1 and φ2 output from delay circuit 10.

When enable signal EN is at high level, locked to the rising edge of clock signal xφin (that is, the falling edge of clock signal φin), flip-flop circuit 703 outputs NOT of AND circuit 702 as signal A1, and holds the output signal level. When enable signal EN is at low level, output signal A1 is set at high level. When enable signal EN is at high level, locked to the rising edge of clock signal xφin (that is, the falling edge of clock signal φin), flip-flop circuit 704 outputs delay signal φ1 as signal B1, and holds the output signal level. When enable signal EN is at low level, output signal B1 is set at low level.

Said transition-judgment circuit 80 judges whether the transition of the phase state judged by phase-judgment circuit 70 is a prescribed transition, and, if it is a prescribed transition, sets signal ABSET at high level. If it is not a prescribed transition, the judge circuit sets signal ABSET at low level. When transition-judgment circuit 80 sets signal ABSET at low level, the operation mode of the DLL circuit transitions to the initializing mode. In the initializing mode, just as the stop mode when enable signal EN is at low level, the DLL operation stops. Said transition-judgment circuit 80 shown in FIG. 14 has two NAND circuits 801 and 802. Said NAND circuit 801 computes NAND of the output signal of NAND circuit 802 and the output signal A1 of phase-judgment circuit 70. NAND circuit 802 computes the NAND of the output of NAND circuit 801 and the output signal B1 of phase-judgment circuit 70. The output signal of NAND circuit 801 becomes signal ABSET.

In the following, an explanation will be given regarding the operation of the DLL circuit in the present embodiment with said constitution. When enable signal EN becomes low-level, the DLL circuit shown in FIG. 10 enters the stop mode, signal ABSET becomes low-level, and the mode becomes the initializing mode. In the stop mode and initializing mode, control voltage V1$f$ of a prescribed initial value is sent from low-pass filter 40 to delay circuit 10, and, as a result, the delay of delay circuit 10 is set within a prescribed range. Here, the delay of delay circuit 10 in the stop mode is set so that the delay of clock signal φdin with respect to clock signal φin is within the range of "0"~"π." Because difference signals φ1 and φ2 are signals output from the first stage 101 and second stage 102 among the four delay elements 101-104 connected in tandem (see FIG. 2), in the stop mode and initializing mode, as the delay of the entirety of delay circuit 10 comes within the range of "0"~"π," the phase difference of delay signal φ2 with respect to clock signal φin certainly becomes smaller than "π." The phase state in which the phase difference of difference signal φ2 with respect to clock signal φin is smaller than "π" is called "state X" here. In state X, at the falling edge of clock signal φin, difference signals φ1 and φ2 become high-level. Also, the phase delay of delay signal φ1 with respect to clock signal φin becomes smaller than "π/2."

Figure 15:
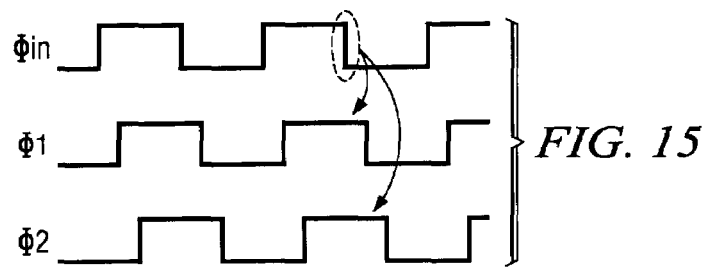
FIG. 15 is a first diagram illustrating an example of timing of the input/output signals of the delay circuit in a prescribed phase.

FIG. 15 is a diagram illustrating an example of the timing of clock signal pin and difference signals φ1 and φ2 in state X. When transition is made from the stop mode or initializing mode to the DLL mode, as explained above with reference to the aforementioned embodiment, phase difference Δφ' detected by phase detector 20 is initially set in the range of "−2π"~"−π." For this purpose, control is performed by delaying the phase of clock signal φdin. By means of this control, in the process until the DLL circuit arrives in a normal locked state, the phase difference of delay signal φ1 with respect to clock signal φin is always kept smaller than "π." The phase state in which the phase difference of delay signal φ1 with respect to clock signal φin is smaller than "π" is called "state Y." The DLL circuit is in the locked state while this state Y is kept as is.

Figure 16:
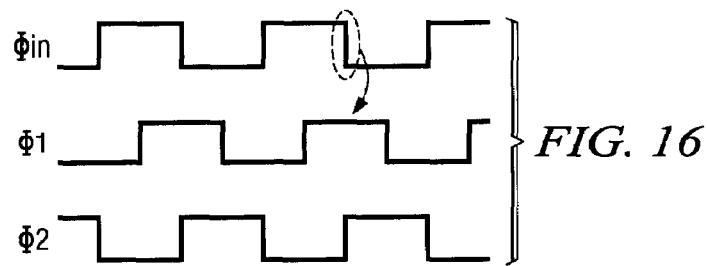
FIG. 16 is a second diagram illustrating an example of timing of the input/output signals of the delay circuit in a prescribed phase.

FIG. 16 is a diagram illustrating an example of the timing of clock signal φin and difference signals φ1 and φ2 in state Y. For the DLL circuit shown in FIG. 10, when transition is performed from the stop mode to the DLL mode to the locked state, the circuit has to go through states X and Y. Other state transitions are abnormal transitions, and an abnormal locked state may be reached. For transition-judgment circuit 80, when such an abnormal state transition takes place, signal ABSET is set at low level, and the operation mode is changed to the initializing mode.

The following table lists the levels and phase states of the various signals (EN, φin, φ1, φ2, ABSET). In the table, "H" represents high level, and "L" represents low level.

TABLE 1

|  | EN | A1 | B1 | ABSET |
|---|---|---|---|---|
| State X (stop mode) | L | L | H | H |
| State X (DLL mode) | H | L | H | H |
| State Y (locked state) | H | H | H | H ← |
| Abnormal state (initializing mode) | H | H | L | L |

In the following, an explanation will be given regarding the relationship between the levels and phase states of the various signals (EN, φin, φ1, φ2, ABSET) with reference to the above table. In the stop mode, the phase states of clock signal φin and difference signals φ1 and φ2 become state X.

As shown in FIG. 15, in state X, at the falling edge of clock signal φin, both difference signals φ1 and φ2 become high level. Consequently, the output signal of AND circuit 702 at the falling edge becomes high-level. As a result, output signal A1 of flip-flop circuit 703 becomes low-level that indicates state X. When output signal A1 becomes low-level, output signal ABSET of transition-judgment circuit 80 becomes high-level. In state X, when transition is made from the stop mode to the DLL mode, as explained above, control is performed to delay the phase of clock signal φdin. As a result, the delay of difference signal φ2 with respect to clock signal φin increases, and difference signal φ2 at the falling edge of clock signal φin becomes low-level, the phase states of clock signal φin and difference signals φ1 and φ2 exit state X, and the output signal A1 of flip-flop circuit 703 becomes high-level. However, in this case, if the phase states of clock signal φin and delay signal φ1 become state Y, delay signal φ1 becomes high-level at the falling edge of clock signal φin. Consequently, output signal B1 of flip-flop circuit 704 remains at high level. In this case, because both signals A1 and A2 become high level, output signal ABSET of transition-judgment circuit 80 is kept at high level as is. Consequently, during the period of transition from the stop mode via state X to the locked state Y, the output signal ABSET of transition-judgment circuit 80 is kept at high level.

On the other hand, when abnormal state transition takes place, for example, when the phase states of clock signal φin and delay signal φ1 exit state Y, output signal A1 of flip-flop circuit 703 becomes high-level, and output signal B1 of flip-flop circuit 704 becomes low-level. In this case, output signal ABSET of transition-judgment circuit 80 becomes low-level, and the operation mode of the DLL circuit enters the initializing mode. When transition is made to the initializing mode because signal ABSET becomes low-level, just as with the aforementioned stop mode, by means of initial value setter (50A) ((51A)), the state of low-pass filter 40 is initialized, and the delay of delay circuit 10 is set within a prescribed range. Also, the detection results of phase detector (20A) (Vup, Vdn) are initialized. By means of this initializing operation, when the overall delay of delay circuit 10 returns to within the range of "0"~"π," at the falling edge of clock signal φin, difference signals φ1 and φ2 become high level, and output signal A1 of phase-judgment circuit 70 becomes low-level. As a result, the operation mode of the DLL circuit returns to state X, and the DLL operation is restarted. Then, transition from this state X to state Y is made, thus entering the normal locked state. As explained above, by means of the DLL circuit of the present embodiment, the state of the phases of at least two signals among the plural signals input/output to delay circuit 10 is judged by phase-judgment circuit 70. If the transition of the judged phase state is judged by transition-judgment circuit 80 to not be the prescribed normal transition, the operation mode is automatically changed to the initializing mode. Consequently, even if the operation of DLL enters an abnormal state, it is still possible to prevent continuous DLL operation in the abnormal state by changing the operation mode to the initializing mode.

Also, by means of the DLL circuit of the present embodiment, as the operation mode becomes the initializing mode due to generation of an abnormal state, the delay of delay circuit 10 is set within the prescribed range by initial value setter A). Then, when transition is made from the initializing mode to the DLL mode, by means of control of phase-detection controller 60, phase difference Δφ' between clock signal φ'in and clock signal φ'din detected by phase detector 20 is set within a prescribed range (such as "−2π"~"π"). Consequently, even if the DLL operation is restarted after stopping DLL operation due to generation of an abnormal state, just as the DLL circuit of said Embodiment 1, it is possible to make transition to a normal locked state.

In addition, for the DLL circuit pertaining to the present embodiment, as the operation mode changes to the initializing mode due to generation of an abnormal state, the delay of delay circuit 10 is initially set within a prescribed range, so that the phase state changes to state X. When the state changes to state X, output signal A1 of phase-judgment circuit 70 becomes low-level, and, corresponding to this change, output signal ABSER of transition-judgment circuit 80 changes to the high level, and the operation mode is automatically changed to DLL. Consequently, when the transition to an abnormal phase state is judged, the operation mode automatically enters the initializing mode, an appropriate phase state is re-entered, and the DLL operation is automatically restarted. That is, it is possible to automatically eliminate abnormal operation of the DLL.

Embodiment 3

In the following, an explanation will be given regarding Embodiment 3 of the present invention. For example, the delay circuit is composed of three delay elements connected in tandem, and the delays of the various delay elements are nearly the same. In this case, the phase relationships of signals φ1-φ3 output from the various delay elements are different as shown in FIGS. 17 and 18 corresponding to the phase difference between input/output of the delay circuit.

Figure 17:
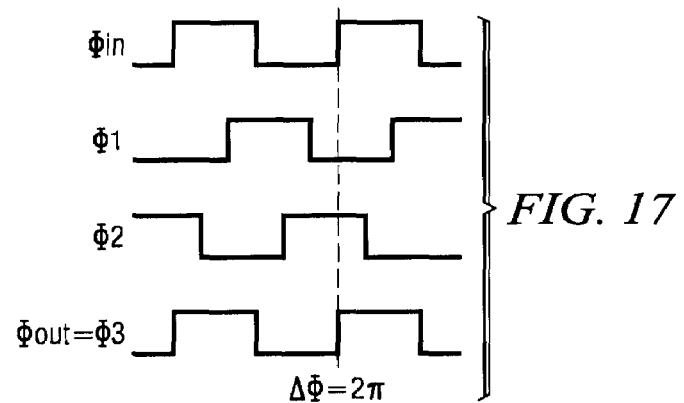
FIG. 17 is a first diagram illustrating an example of timing of the input/output signals of the delay circuit in the locked state.
Figure 18:
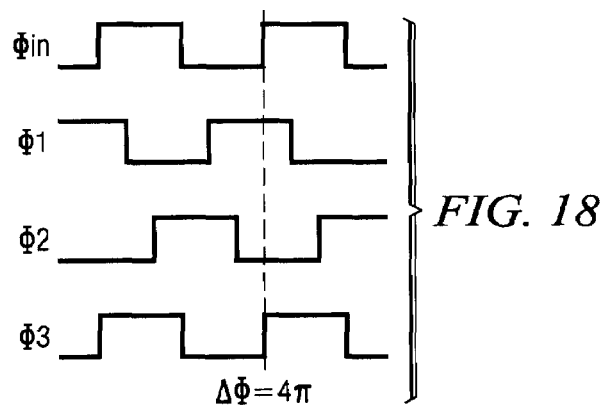
FIG. 18 is a second diagram illustrating an example of timing of the input/output signals of the delay circuit in the locked state.

FIGS. 17 and 18 are diagrams illustrating an example of the timing of clock signal φin and difference signals φ1-φ3 output from the delay circuits. FIG. 17 is a diagram illustrating when the phase difference between the input/output and the delay circuit is "2π," and FIG. 18 is a diagram illustrating the timing when the phase difference is "4π." When the phase difference between input/output is "2π," as shown in FIGS. 17(B), (C), the phase of delay signal φ1 is advanced by "2π/3" with respect to difference signal φ2. On the other hand, when the phase difference between input/output is "4π," as shown in FIGS. 18(B), (C), delay signal φ1 delays by a phase of "2π/3" with respect to difference signal φ2. That is, when the phase difference between input/output of the delay circuit composed of three delay elements is switched alternately between "2π" and "4π," the relationship of "phase advance" and "phase delay" between the signals output from adjacent delay elements is switched alternately with the same phase difference. In this way, in order to change the phase relationship of the delay signals, one may change the phase difference between input/output of the delay circuit in the locked state of the DLL.

For the DLL circuit of the present embodiment, in order to change the phase difference of the locked state, the phase-detection controller is used. That is, when transition is made from the stop mode to the DLL mode, the number of clock pulses of clock signal φin excluded from the object detected by the phase detector can be freely changed to correspond with to the control signal. As a result, it is possible to freely change the phase relationship of the output signal of the delay circuit to change the phase difference between input/output of the delay circuit in the locked state.

Figure 19:
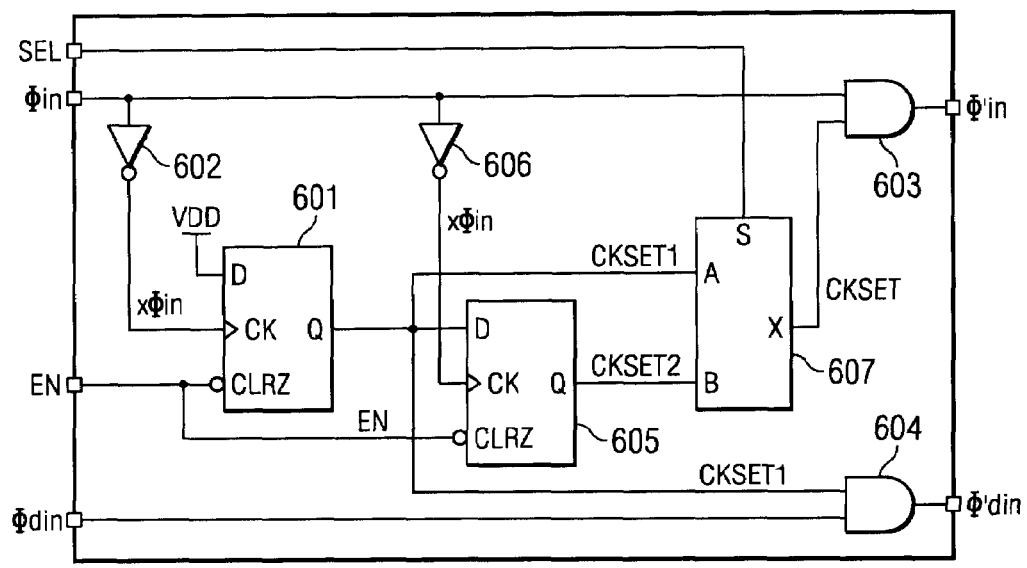
FIG. 19 is a diagram illustrating an example of the constitution of the phase-detection controller in the DLL circuit pertaining to Embodiment 3.

In the following, an explanation will be given regarding an example of the DLL circuit pertaining to the present embodiment. This DLL circuit has the same constitution as that of the DLL circuit shown in FIGS. 1 and 10 except for the phase-detection controller. Consequently, in the following, an explanation will be given only regarding the phase-detection controller. FIG. 19 is a diagram illustrating an example of the constitution of the phase-detection controller in the DLL circuit pertaining to the present embodiment. Phase-detection controller (60A) shown in FIG. 19 has flip-flop circuit 605, inverter circuit 606 and selector circuit 607 in phase-detection controller 60 shown in FIG. 6. Said inverter circuit 606 generates clock signal xφin as NOT of clock signal φin. When enable signal EN is at high level and locked to the rising edge of clock signal xφin of inverter circuit 606, said flip-flop circuit 605 outputs high-level signal CKSET2 and holds the level. When enable signal EN is at low level, signal CKSET2 is set at low level without regard to clock signal xφin. When selection signal SEL is at high level, selector circuit 607 selects output signal CKSET1 of flip-flop circuit 601, and, when selection signal SEL is at low level, output signal CKSET2 of flip-flop circuit 605 is selected and output. AND circuit 603 computes the AND of the output signal of said selector circuit 607 and clock signal spin, and outputs the obtained signal as clock signal φ'in.

Figure 20:
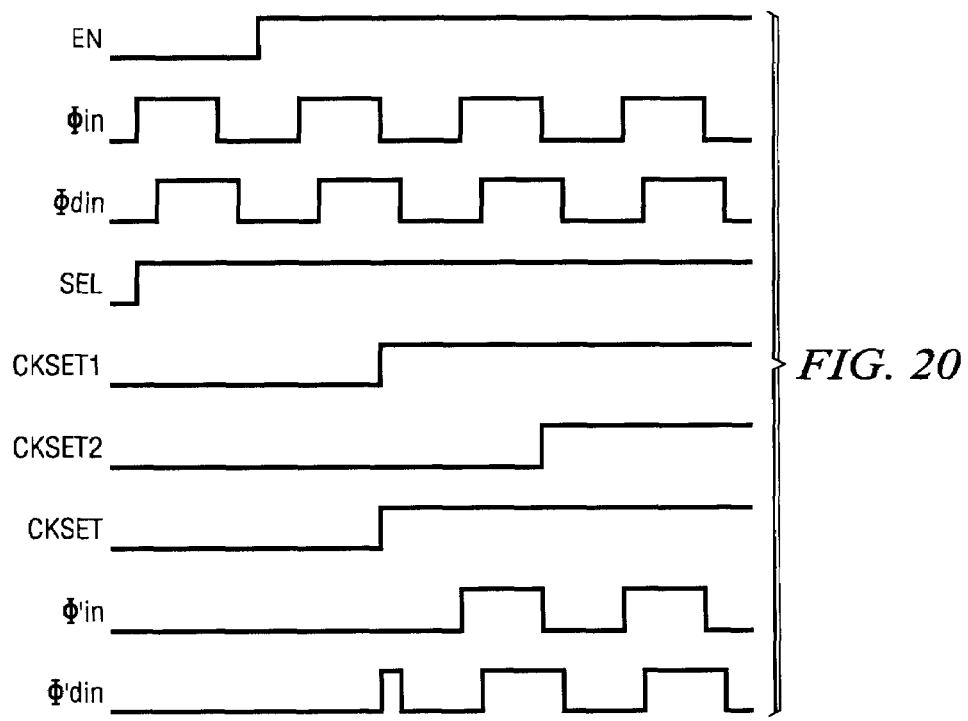
FIG. 20 is a diagram illustrating an example of timing of the various signals of the DLL circuit when the selection signal is at high level.
Figure 21:
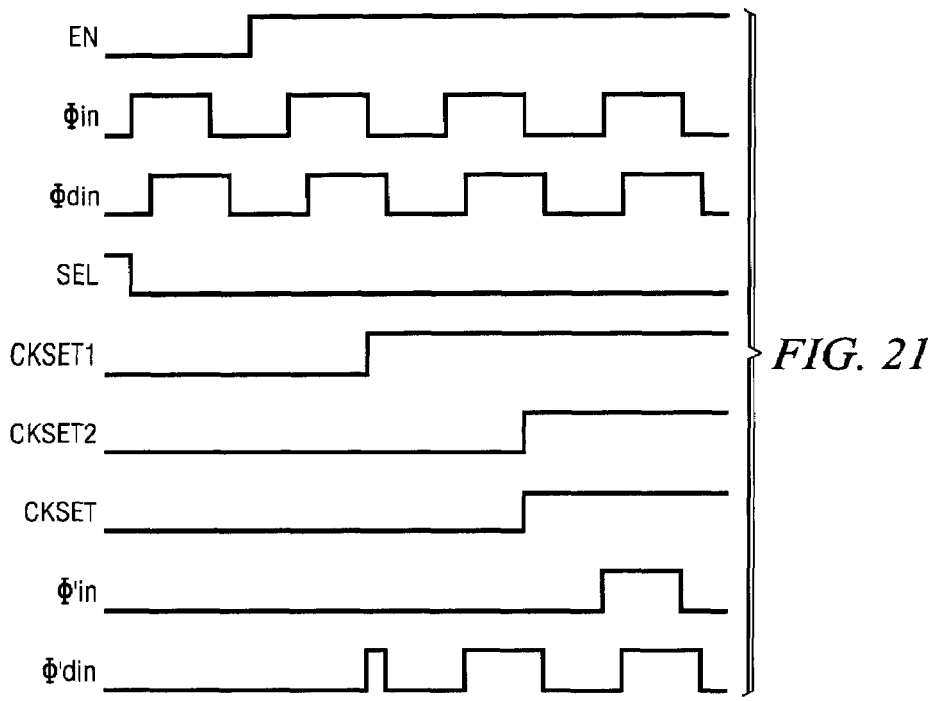
FIG. 21 is a diagram illustrating an example of timing of the various signals of the DLL circuit when the selection signal is at low level.
Figure 22:
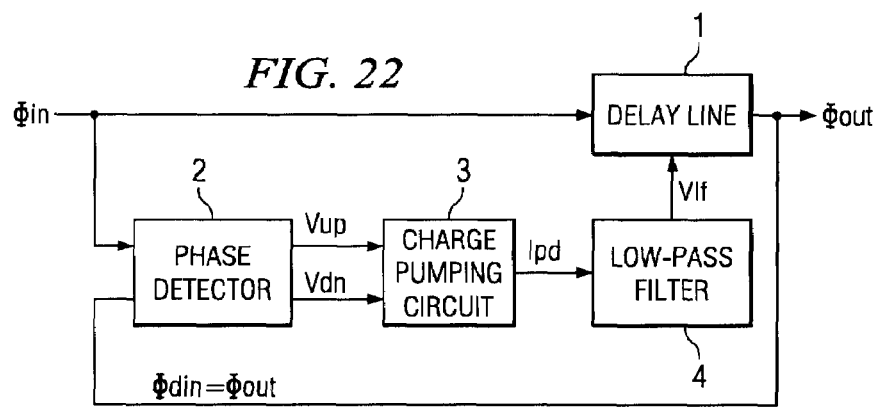
FIG. 22 is a diagram illustrating an example of the constitution of a conventional DLL circuit.
Figure 23:
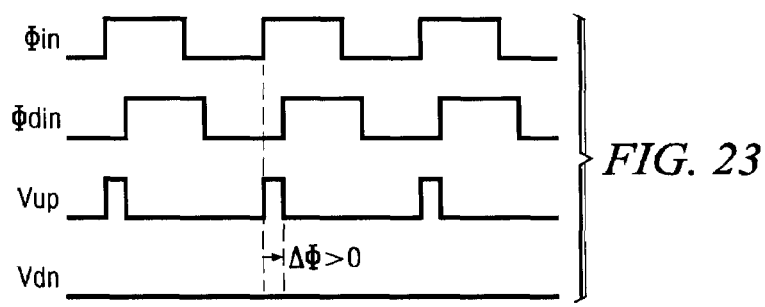
FIG. 23 is a first diagram illustrating advance and delay in the phase detected by the phase detector.
Figure 24:
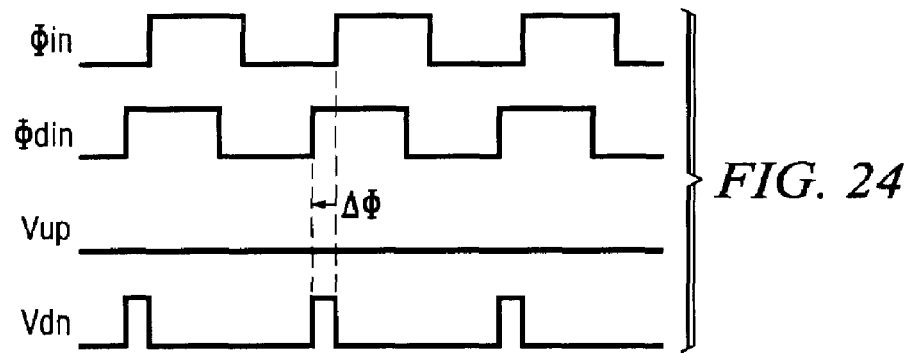
FIG. 24 is a second diagram illustrating advance and delay in the phase detected by the phase detector.

FIG. 20 is a diagram illustrating an example of the timing of the various signals in the DLL circuit when selection signal SEL is at high level. In this case, because output signal CKSET1 of flip-flop circuit 601 is selected by selector circuit 607, the operation in this case becomes the same as that of phase-detection controller 60 shown in FIG. 6. That is, the clock pulses of 1 cycle of clock signal φin are removed, and phase difference Δφ' detected by phase detector 20 is set in the range of "−2π"~"−π." Consequently, the phase difference between the input/output of the delay circuit in the locked state becomes "2π." On the other hand, FIG. 21 is a diagram illustrating an example of timing of the various signals of the DLL circuit when selection signal SEL is at low level. In this case, by means of selector circuit 607, output signal CKSET2 of flip-flop circuit 605 is selected. For output signal CKSET2 of flip-flop circuit 605, there is no change to high level after the mode is changed from the stop mode to the DLL mode until the falling edge of clock signal φin is generated for the second round. Because the output of clock signal φin from AND circuit 603 is inhibited until signal CKSET2 is changed to high level, 2 cycles of clock pulses of clock signal φin are removed. As a result, clock signal φ'in is delayed by "4π" with respect to clock signal φ'din, and the initial phase difference Δφ' is set in the range of "−4π"~"−3π." Consequently, the phase difference between input/output of the delay circuit in the locked state becomes "4π."

As explained above, for the DLL circuit of the present embodiment, when transition is performed from the stop mode to the DLL mode, the number of clock pulses excluded from the object detected by the phase detector can be changed corresponding to selection signal SEL. As a result, it is possible to change the phase difference between the input/output of the delay circuit in the locked state, and it is possible to change the phase relationship between the signals output from the various delay elements of the delay circuit.

In the above, explanation has been provided for several embodiments of the present invention. However, the present invention is not limited to the aforementioned embodiments, and alternative variations may be adopted. In the aforementioned embodiments, when transition is performed from the stop mode to the operation mode, the clock pulses of 1 cycle are excluded from the object detected by the phase detector by means of the phase-detection controller. However, the present invention is not limited to this scheme. For example, one may adopt a scheme in which the clock pulses of plural cycles are excluded. Similarly, the initial delay set in the delay circuit in the stop mode may be set freely. In this way, the number of clock pulses to be excluded from the phase object detected by the phase detector at the start of the DLL operation and the initial delay set in the delay circuit in the stop mode can be freely set, and it is possible to freely set the phase difference between input/output of the delay circuit in the locked state.

In the aforementioned embodiments, the clock pulses of clock signal φin in the phase-detection controller when transition is made from the stop mode to the operation mode are excluded from the object detected by the phase. However, the present invention is not limited to this scheme. For example, one may also adopt a scheme in which the apparent phase is delayed by removing the clock pulses of clock signal φdin output from the delay circuit. In this case, because of control to advance the initial phase of clock signal φdin, by setting the initial delay of the delay circuit set by the initial value setter in the range of, say, "2π"~"4π," it is possible for the DLL circuit to be in the locked state when the delay of clock signal φdin with respect to clock signal φin becomes "2π."

In the aforementioned embodiments, the clock pulses in the phase-detection controller are removed by an AND circuit. However, the present invention is not limited to this scheme. For example, one may also adopt a scheme in which the phase-detection controller does not respond to the input of the clock pulses by feeding the reset signal to the flip-flop circuit of the phase detector.

The invention claimed is:

1. A delay-locked loop circuit comprising:
   a delay circuit, providing plural different delays corresponding to an input control signal for an input first clock signal, and outputting one of said plural delay signals as a second clock signal;
   a phase detector detecting the advance or delay in the phase of said second clock signal with respect to said first clock signal,
   a delay controller, which generating said control signal setting the delay of said delay circuit in a predetermined range in a first mode, and generating said control signal to control the delay of said delay circuit so that the advance or delay in the phase detected by said phase detector is reduced in a second mode,
   a phase-detection controller setting the advance or delay in the phase of said second clock signal detected by said phase detector in the predetermined range when transition from said first mode to said second mode occurs;
   a phase-judgment circuit judging the phase state for two signals among plural signals input/output to/from said delay circuit; and a transition-judgment circuit judging whether the transition of the phase state judged with said phase-judgment circuit is a predetermined transition, and, if it is not the predetermined transition, changes the operation mode to said first mode.

2. The delay-locked loop circuit described in claim 1 wherein said phase-judgment circuit judges said phase state based on the level of another signal at a rising edge or falling edge of one signal among plural signals as the judgment object.

3. The delay-locked loop circuit described in claim 2, wherein said delay controller contains:
   a charge-pumping circuit generating a current corresponding to the detection result of said phase detector;
   a low-pass filter smoothing the current generated by said charge pumping circuit and generating a control signal; and
   an initial value setting circuit generating a current for setting said control signal at the predetermined initial value fed to said low-pass filter in said first mode.

4. The delay-locked loop circuit described in claim 1 wherein said operation mode is changed to said second mode when the prescribed phase state is judged in said phase-judgment circuit after the operation mode is changed to said first mode.

5. The delay-locked loop circuit described in claim 1, wherein said phase-detection controller excludes from the object detected by said phase detector at least one cycle of the clock pulse of said first clock signal or said second clock signal when transition is made from said first mode to said second mode.

6. The delay-locked loop circuit described in claim 5 wherein said phase detector detects phase difference between said first clock signal and said second clock signal based on time difference between a pulse edge as a reference point of the clock cycle in said first clock signal and a pulse edge as a reference point of the clock cycle in said second clock signal, and, at the same time, judges whether phase of said second clock signal is advanced with respect to said first clock signal during said transition based on the order of generation of said pulse edges when transition is made from said first mode to said second mode; and
   when transition is made from said first mode to said second mode, said phase-detection controller excludes said pulse edges of at least one cycle of said first clock signal or said second clock signal input to said phase detector.

7. The delay-locked loop circuit described in claim 5, wherein said phase-detection controller changes the number of said clock pulses excluded from the object detected by said phase detector in transition from said first mode to said second mode corresponding to an input second control signal.

8. The delay-locked loop circuit described in claim 5, wherein said delay controller contains:
   a charge-pumping circuit generating a current corresponding to the detection result of said phase detector;
   a low-pass filter smoothing the current generated by said charge pumping circuit and generating a control signal; and
   an initial value setting circuit generating a current for setting said control signal at the predetermined initial value fed to said low-pass filter in said first mode.

9. The delay-locked loop circuit described in claim 1 wherein said phase detector detects phase difference between said first clock signal and said second clock signal based on time difference between a pulse edge as a reference point of the clock cycle in said first clock signal and a pulse edge as a reference point of the clock cycle in said second clock signal, and, at the same time, judges whether phase of said second clock signal is advanced with respect to said first clock signal during said transition based on the order of generation of said pulse edges when transition is made from said first mode to said second mode; and
   when transition is made from said first mode to said second mode, said phase-detection controller excludes said pulse edges of at least one cycle of said first clock signal or said second clock signal input to said phase detector.

10. The delay-locked loop circuit described in claim 9, wherein said phase-detection controller changes the number of said clock pulses excluded from the object detected by said phase detector in transition from said first mode to said second mode corresponding to an input second control signal.

11. The delay-locked loop circuit described in claim 10, wherein said delay controller contains:
   a charge-pumping circuit generating a current corresponding to the detection result of said phase detector;
   a low-pass filter smoothing the current generated by said charge pumping circuit and generating a control signal; and
   an initial value setting circuit generating a current for setting said control signal at the predetermined initial value fed to said low-pass filter in said first mode.

12. The delay-locked loop circuit described in claim 9, wherein said phase-detection controller changes the number of said clock pulses excluded from the object detected by said phase detector in transition from said first mode to said second mode corresponding to an input second control signal.

13. The delay-locked loop circuit described in claim 9, wherein said delay controller contains:
   a charge-pumping circuit generating a current corresponding to the detection result of said phase detector;
   a low-pass filter smoothing the current generated by said charge pumping circuit and generating a control signal; and
   an initial value setting circuit generating a current for setting said control signal at the predetermined initial value fed to said low-pass filter in said first mode.

14. The delay-locked loop circuit described in claim 1, wherein said delay controller contains:
   a charge-pumping circuit generating a current corresponding to the detection result of said phase detector;
   a low-pass filter smoothing the current generated by said charge pumping circuit and generating a control signal; and
   an initial value setting circuit generating a current for setting said control signal at the predetermined initial value fed to said low-pass filter in said first mode.

15. The delay-locked loop circuit described in claim 1, wherein said delay controller contains:
   a charge-pumping circuit generating a current corresponding to the detection result of said phase detector;
   a low-pass filter smoothing the current generated by said charge pumping circuit and generating a control signal; and
   an initial value setting circuit generating a current for setting said control signal at the predetermined initial value fed to said low-pass filter in said first mode.

16. A delay-locked loop circuit comprising:
   an input terminal for receiving a first clock signal, a delay circuit coupled to said input terminal providing a delay to a first clock signal corresponding to a delay control signal, and outputting it as a second clock signal, an output terminal for said second clock signal, a signal translation circuit coupled to said input terminal and said output terminal and outputting said first clock signal and said second clock signal as a third clock signal and a fourth clock signal, respectively, a phase comparator coupled to said signal translation circuit and outputting a phase difference signal corresponding to phase difference between said third clock signal and said fourth clock signal, and a delay controller coupled to said phase comparator and outputting a delay control signal for controlling delay time of said delay circuit corresponding to said phase difference signal, and wherein said signal translation circuit responds to an enable signal to mask at least one cycle of the clock pulse of said first clock signal or said second clock signal, and outputs the obtained signal in place of said third clock signal or said fourth clock signal.

17. The delay-locked loop circuit described in claim 16 wherein said delay controller comprises:

a charge-pumping circuit coupled to said phase comparator and outputting a current signal corresponding to said phase difference signal;

a low-pass filter coupled to said charge-pumping circuit and outputting a voltage signal corresponding to said current signal as a delay control signal; and an initial value setting circuit coupling a predetermined current signal corresponding to said enable signal to said low-pass filter.

18. The delay-locked loop circuit described in claim 16 wherein said delay circuit is a delay-locked loop circuit, which outputs first ~$n^{th}$ signals (n is an integer of 3 or larger) having prescribed phase differences, respectively, and which feeds said $n^{th}$ output signal as said second clock signal to said output terminal;

a phase state judgment circuit coupled to said delay circuit for judging phase state of said first delay signal and said second delay signal, and outputting a control signal when the phase state is not a prescribed state; and said signal translation circuit responsive to said control signal to mask at least one cycle of clock pulse of said first clock signal or said second clock signal, and outputs the obtained signal as said third clock signal or said fourth clock signal.

19. The delay-locked loop circuit described in claim 18 wherein said initial value setting circuit responds to said control signal to feed said prescribed current signal.

* * * * *